(12) United States Patent
Ou

(10) Patent No.: US 9,116,797 B2
(45) Date of Patent: Aug. 25, 2015

(54) FLASH MEMORY DEVICES INCLUDING RESERVE UNITS OPERATING IN ABNORMAL SITUATIONS AND CONTROLLING METHODS THEREOF

(71) Applicant: Silicon Motion, Inc., Jhubei (TW)

(72) Inventor: Hsu-Ping Ou, Zhubei (TW)

(73) Assignee: SILICON MOTION, INC., Jhubei (TW)

( * ) Notice: Subject to any disclaimer, the term of this patent is extended or adjusted under 35 U.S.C. 154(b) by 279 days.

(21) Appl. No.: 13/752,502

(22) Filed: Jan. 29, 2013

(65) Prior Publication Data

US 2014/0068147 A1 Mar. 6, 2014

(30) Foreign Application Priority Data

Sep. 3, 2012 (TW) .............................. 101131974 A

(51) Int. Cl.
| | |
|---|---|
| *G06F 12/00* | (2006.01) |
| *G06F 12/02* | (2006.01) |
| *G06F 11/20* | (2006.01) |
| *G11C 29/00* | (2006.01) |

(52) U.S. Cl.
CPC ........ *G06F 12/0246* (2013.01); *G06F 11/2089* (2013.01); *G06F 11/2092* (2013.01); *G11C 29/00* (2013.01)

(58) Field of Classification Search
CPC .. G06F 11/2089; G06F 11/2092; G11C 29/00
USPC .......... 714/718, 2; 365/201, 180.02; 711/103, 711/154, 158; 713/100
See application file for complete search history.

(56) References Cited

U.S. PATENT DOCUMENTS

| | | | |
|---|---|---|---|
| 5,960,445 A * | 9/1999 | Tamori et al. ................. | 717/168 |
| 6,560,699 B1 * | 5/2003 | Konkle ............................ | 713/1 |
| 2001/0048611 A1 * | 12/2001 | Pitts ........................ | 365/185.11 |
| 2002/0110028 A1 * | 8/2002 | Hassan et al. ................. | 365/200 |
| 2008/0297165 A1 * | 12/2008 | Kurihara et al. .............. | 324/537 |
| 2010/0156448 A1 * | 6/2010 | Chen et al. .................... | 324/756 |
| 2010/0211767 A1 * | 8/2010 | Chu et al. .......................... | 713/2 |
| 2012/0072790 A1 * | 3/2012 | Burggraf et al. .............. | 714/718 |
| 2012/0278540 A1 * | 11/2012 | Lin et al. ....................... | 711/103 |

* cited by examiner

*Primary Examiner* — Hong Kim
(74) *Attorney, Agent, or Firm* — Wang Law Firm, Inc.; Li K. Wang; Stephen Hsu

(57) ABSTRACT

A flash memory controller is provided. The flash memory controller includes a read/write unit, a state machine, a processing unit, and a reserve unit. The read/write unit is coupled to a flash memory. The read/write unit is configured to perform a write command or a read command. The state machine is configured to determine a state of the flash memory controller. The processing unit is coupled to the read/write unit and the state machine. The processing unit is configured to control the read/write unit. The reserve unit is coupled to a first data line, a second data line, and the read/write unit. When the flash memory controller is operating abnormally, the reserve unit receives an external signal via the first data line and the second data line and controls the read/write unit according to the external signal.

21 Claims, 4 Drawing Sheets

FLASH MEMORY DEVICES INCLUDING RESERVE UNITS OPERATING IN ABNORMAL SITUATIONS AND CONTROLLING METHODS THEREOF

CROSS REFERENCE TO RELATED APPLICATIONS

This application claims the benefit of Taiwan application Serial No. 101131974 filed Sep. 3, 2012, the subject matter of which is incorporated herein by reference.

BACKGROUND OF THE INVENTION

1. Field of the Invention

The invention relates to a flash memory device, and more particularly to an embedded flash memory device.

2. Description of the Related Art

Non-volatile memories are widely applied in various applications, such as solid-state disks (SSDs), memory cards, digital cameras, digital video cameras, multimedia displayers, mobile phones, computers, and other electronic devices.

However, when data (such as firmware and tables) stored in a flash memory is lost or damaged, a processing unit in a flash memory controller may operate abnormally, such that users can not read contents stored in the flash memory. Thus, it is desired to provide a flash memory controller which is still capable of analyzing and restoring data stored in a flash memory when the data is damaged.

BRIEF SUMMARY OF THE INVENTION

An exemplary embodiment of a flash memory controller is provided. The flash memory controller comprises a read/write unit, a state machine, a processing unit, and a reserve unit. The read/write unit is coupled to a flash memory. The read/write unit is configured to perform a write command or a read command. The state machine is configured to determine a state of the flash memory controller. The processing unit is coupled to the read/write unit and the state machine. The processing unit is configured to control the read/write unit. The reserve unit is coupled to a first data line, a second data line, and the read/write unit. When the flash memory controller is operating abnormally, the reserve unit receives an external signal via the first data line and the second data line and controls the read/write unit according to the external signal.

An exemplary embodiment of a controlling method for a flash memory controller is provided. The flash memory controller comprises a read/write unit, a state machine, and a processing unit and a flash memory. The controlling method comprises the step of: determining whether the flash memory is operating normally; receiving an external signal via a first data line and a second data line by a reserve unit of the flash memory controller when the flash memory controller is operating abnormally; and controlling the read/write unit according to the external signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
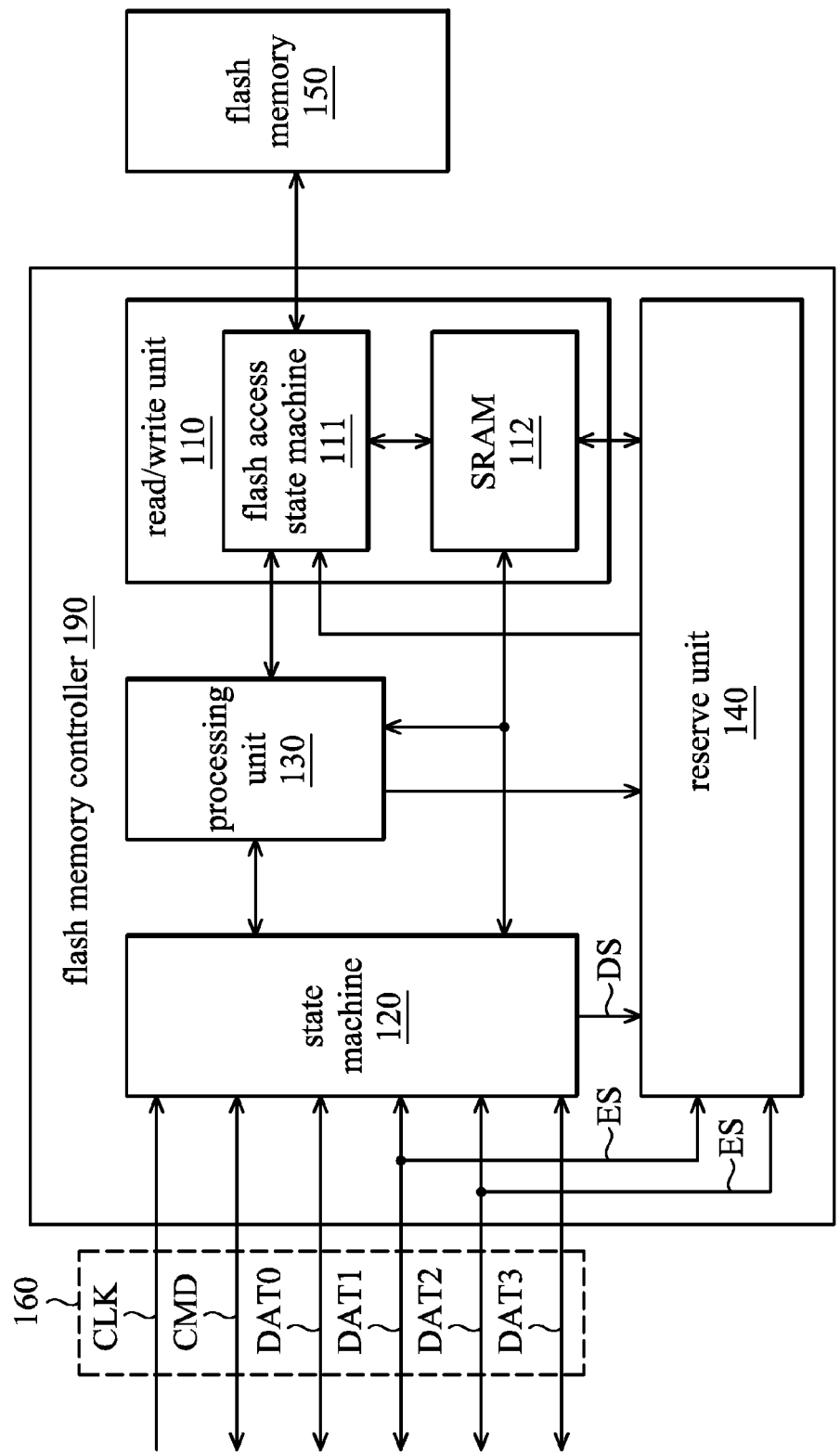
FIG. 1 shows an exemplary embodiment of a flash memory controller 190.

Flash memory controllers are provided. In an exemplary embodiment of a flash memory controller in FIG. 1, a flash memory controller 190 comprises a read/write unit 110, a state machine 120, a processing unit 130, and a reserve unit 140. The read/write unit 110 is coupled to a flash memory 150 and configured to execute a write command or a read command.

In detail, the read/write unit 110 comprises a flash access state machine 111 and a static random access memory (SRAM) 112. The flash access state machine 111 is coupled between the processing unit 130 and the flash memory 150 and configured to execute a write command or a read command. The flash memory 150 can be implemented by a NAND flash memory or a NOR flash memory.

Moreover, the flash access state machine 111 outputs an access signal to the flash memory 150. The access signal may comprise a chip enabling signal CE#, a command latch enable signal ELC, an address latch enable signal ALE, a write enable signal WE#, a read enable signal ER#, and a ready/busy signal R/B#. The SRAM 112 is coupled to the flash access state machine 111, the state machine 120, and the processing unit 130 and configured to store any data from the state machine 120 or the processing unit 130.

The state machine 120 is configured to determine the state of the flash memory controller 190. The state machine 120 is coupled between the processing unit 130 and a host (such as a host device 270 in FIG. 2). The state machine 120 communicates with the host device via a transmission channel 160 which conforms to an embedded flash memory specification. The state machine 120 can be implemented by an embedded multi media card state machine (EMMC state machine) or a secure digital memory card state machine (SD state machine).

The processing unit 130 is coupled to the read/write unit 110 and the state machine 120 and configured to control the read/write unit 110. The reserve unit 140 is coupled data lines DAT1 and DAT2, the read/write unit 110, the processing unit 130, and the state machine 120. When the flash memory controller 190 is operating abnormally, the reserve unit 140 receives an external signal ES via the data lines DAT1 and DAT2 and controls the read/write unit 110 according to the external signal ES. However, when the flash memory controller 190 is operating normally, the state machine 120 outputs a sleep signal DS to the reserve unit 140. When receiving the sleep signal DS, the reserve unit 140 stops operating.

It is assumed that the state machine 120 has two modes: one is the serial peripheral interface mode (SPI mode), and the other is the secure digital mode (SD mode). When the state machine 120 is an SD state machine, the transmission channel 160 comprises a clock line CLK, a command line CMD, and a plurality of data lines DAT0~DAT3. When the state machine 120 is an EMMC state machine, the transmission channel 160 comprises a clock line CLK, a command line CMD, and a plurality of data lines DAT0~DAT7.

Moreover, when the state machine 120 operates in the SD mode, only the data lines DAT0~DAT3 can transmit signals. When the date machine 120 operates in the SPI mode, the data line DAT0 is used by the host device, and the data line DAT3 operates at a ground level. Thus, there is a preferred embodiment where the data lines DAT1 and DAT2 are used to receive the external signal ES.

Figure 2:
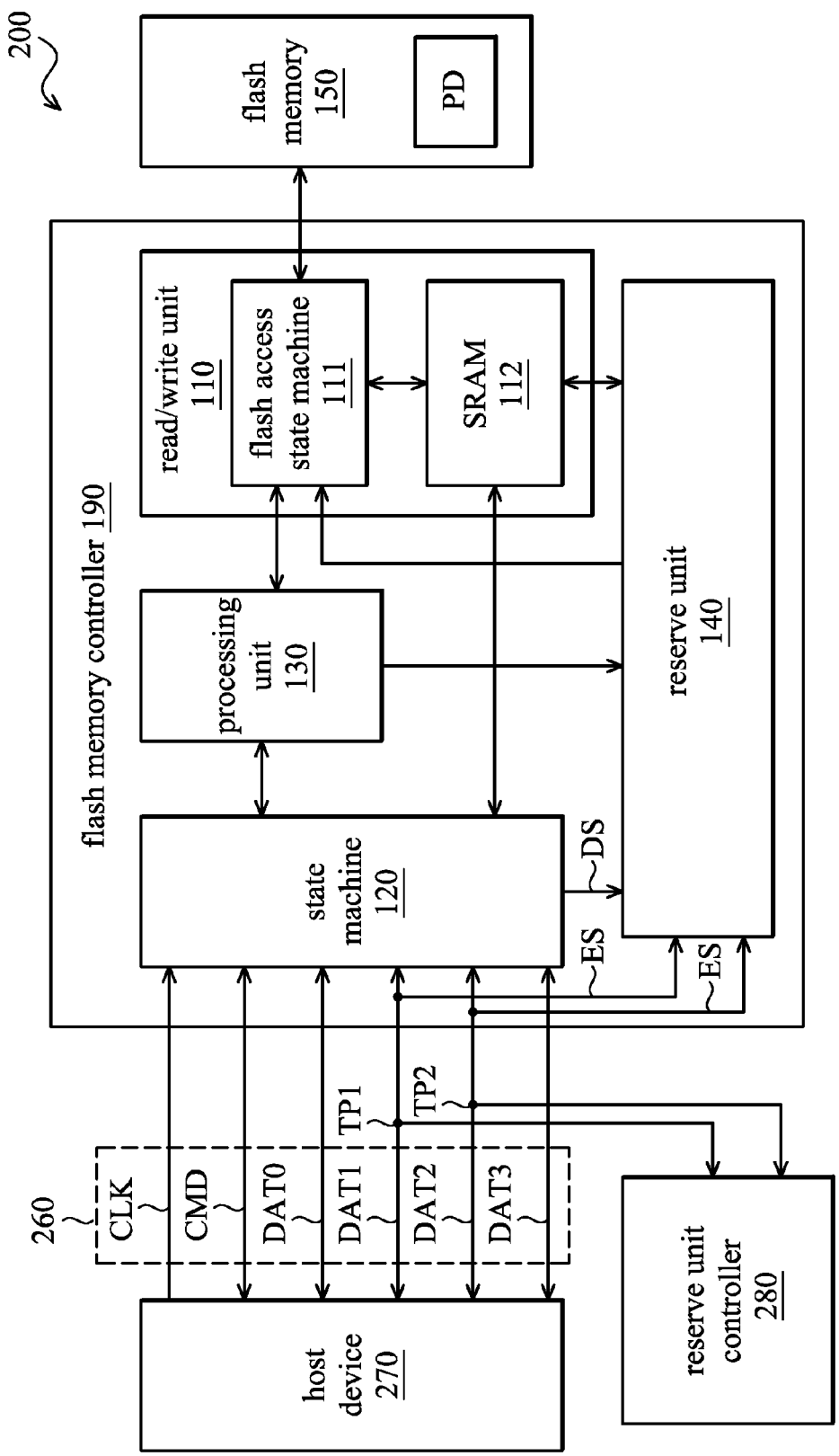
FIG. 2 shows an exemplary embodiment of a flash memory system 200.

FIG. 2 shows an exemplary embodiment of a flash memory system 200. As shown in FIG. 2, the flash memory system 200 comprises the flash memory 150, the flash memory controller 190, and a reserve unit controller 280. The combination of the flash memory 150 and the flash memory controller 190 is an embedded multi media card (EMMC) which is coupled to the host device 270. The reserve unit controller 280 is configured to output the external signal ES. The external signal ES conforms to the inter-integrated circuit bus (I2C-BUS) protocol. In detail, the reserve unit 140 communicates with the reserve unit controller 280 by using the I2C-BUS protocol. In other words, the reserve unit 140 is a slave device of an inter-integrated circuit, while the reserve unit controller 280 is a host device of the inter-integrated circuit. In the embodiment, the flash memory 150, the flash memory controller 190, and the host device 270 are disposed on the same circuit board, wherein the flash memory 150 and the flash memory controller 190 are soldered on the circuit board.

Moreover, in the embodiment, there are test pads TP1 and TP2 reserved for the data lines DAT1 and DAT2 on the circuit board. When the flash memory controller 190 is operating abnormally (regardless of the any reasons), the reserve unit controller 280 is coupled to the test pads TP1 and TP2 of the data lines DAT1 and DAT2. Accordingly, the reserve control unit 280 can control the reserve unit 140 via the channels of the data lines DAT1 and DAT2 by using the I2C-BUS protocol, and the reserve unit 140 can control the flash access state machine 111 and the SRAM 112. There are several reasons why the flash memory controller 190 may operate abnormally, including an error occurring in any one element in the flash memory controller 190 or an abnormal operation of the processing unit 130 caused by incorrect processing data PD (including firmware).

The reserve unit controller 280 may modify the wrong content in the flash memory 150 through the reserve unit 140, such that the processing unit 130 can not stop operating due to the errors in the flash memory 150. In some embodiments, when the processing unit 130 is operating abnormally due to damage to the processing unit 130 or certain content in the flash memory 150, the reserve unit 140 may further output all the contents in the flash memory 150 to the reserve unit controller 280 to achieve the purpose of restoring data.

Figure 3:
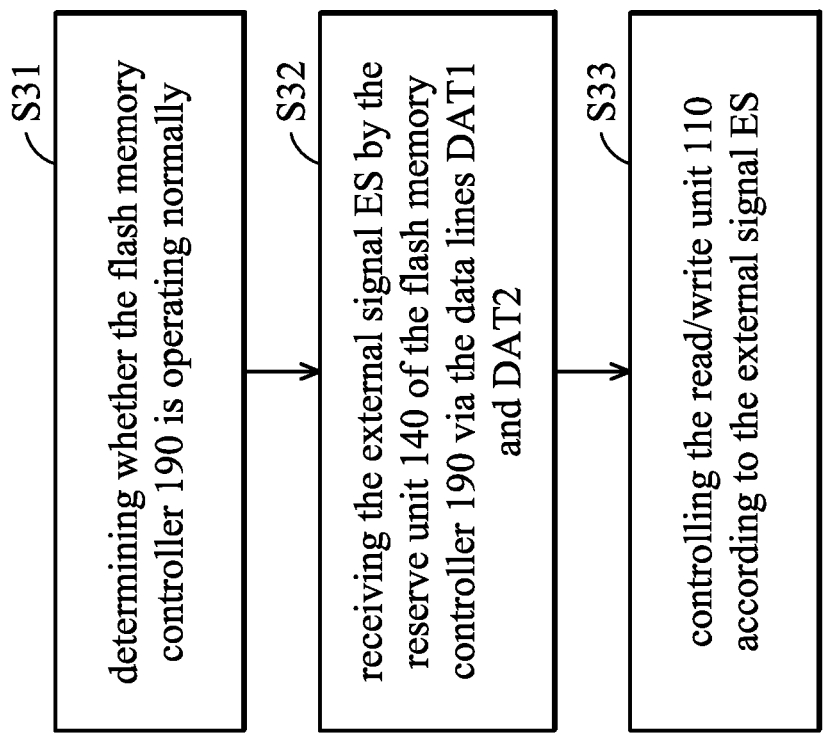
FIG. 3 is a flow chat of an exemplary embodiment of a controlling method for a flash memory.

FIG. 3 is a flow chat of an exemplary embodiment of a controlling method for a flash memory. As shown in FIG. 3, the controlling method comprises the following steps.

At Step S31, it is determine whether the flash memory controller 190 is operating normally. When the flash memory controller 190 is operating abnormally, the method proceeds to Step S32. At Step S32, the external signal ES is received by the reserve unit 140 of the flash memory controller 190 via the data lines DAT1 and DAT2. At Step S33, the read/write unit 110 is controlled according to the external signal ES.

Figure 4:
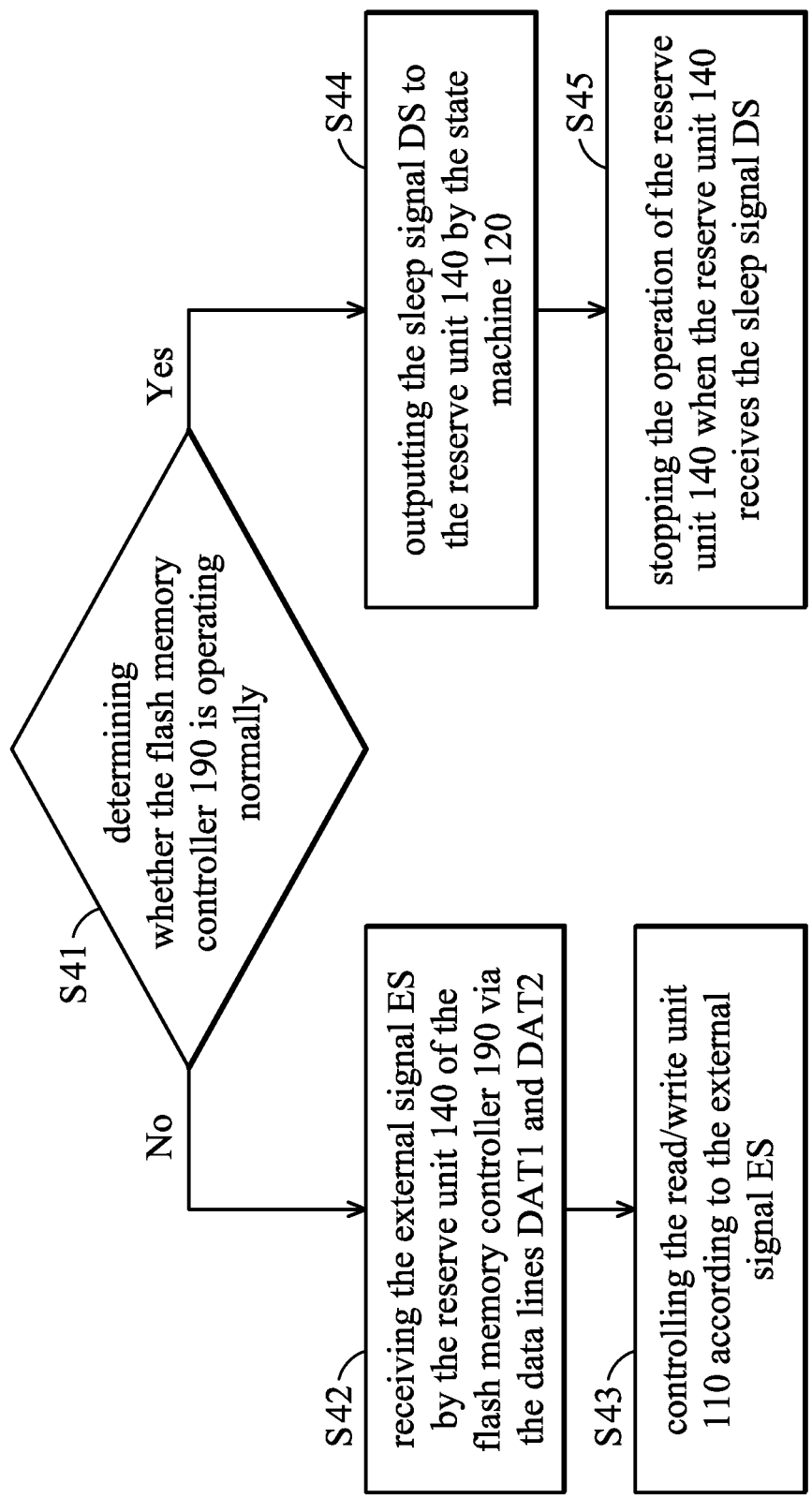
FIG. 4 is a flow chat of another exemplary embodiment of a controlling method for a flash memory.

FIG. 4 is a flow chat of another exemplary embodiment of a controlling method for a flash memory. As shown in FIG. 4, Step S41~Step 43 the same as Step S31~Step 33. When the flash memory controller 190 is operating normally, the method proceeds to Step S44. At Step S44, the sleep signal DS is output by the state machine 120 to the reserve unit 140.

At Step S45, when the reserve unit 140 receives the sleep signal DS, the operation of the reserve unit 140 stops.

As the above describes, when the processing unit 130 is operating abnormally due to errors in the flash memory 150, de-soldering of the flash memory controller 190 or the flash memory 150 or adding extra test pads to access the contents of the flash memory 150 are not needed. The interior data of the flash memory 150 can be still analyzed or restored just by connecting the reserve unit controller 280 to two original footprints at a channel 260 or the test pads TP1 and TP2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory controller comprising:
   a read/write unit, coupled to a flash memory, performing a write command or a read command;
   a state machine for determining a state of the flash memory controller;
   a processing unit, coupled to the read/write unit and the state machine, controlling the read/write unit; and
   a reserve unit, coupled to a first data line, a second data line, and the read/write unit,
   wherein when the flash memory controller is operating abnormally, the reserve unit receives an external signal via the first data line and the second data line and controls the read/write unit according to the external signal,
   wherein when the flash memory controller is operating normally, the state machine outputs a sleep signal to the reserve unit,
   wherein when the reserve unit receives the sleep signal, the reserve unit stops operating.

2. The flash memory controller as claimed in claim 1, wherein the processing unit controls the read/write unit by instructing the read/write unit to execute the write command.

3. The flash memory controller as claimed in claim 1, wherein the processing unit controls the read/write unit by instructing the read/write unit to execute the read command.

4. The flash memory controller as claimed in claim 1, wherein the first data line is DAT1, and the second data line is DAT2.

5. The flash memory controller as claimed in claim 1 further comprising:
   a reserve unit controller coupled to the first data line and the second data line.

6. The flash memory controller as claimed in claim 5, wherein the reserve unit is configured to output the external signal.

7. The flash memory controller as claimed in claim 1, wherein the external signal conforms to an inter-integrated circuit bus (I2C-BUS) protocol.

8. The flash memory controller as claimed in claim 1, wherein the reserve unit is further coupled to the processing unit.

9. The flash memory controller as claimed in claim 1, wherein the reserve unit is further coupled to the state machine.

10. The flash memory controller as claimed in claim 1, wherein the read/write unit comprises:
    a flash access state machine reading data from the flash memory; and
    a static random access memory storing data.

11. The flash memory controller as claimed in claim 1, wherein the flash memory controller is an embedded flash memory controller.

12. A controlling method for a flash memory controller comprising a read/write unit, a state machine, and a processing unit and a flash memory, comprising:
   determining whether the flash memory is operating normally;
   receiving an external signal via a first data line and a second data line by a reserve unit of the flash memory controller when the flash memory controller is operating abnormally;
   controlling the read/write unit according to the external signal;
   outputting a sleep signal to the reserve unit by the state machine when the flash memory controller is operating normally; and
   stopping an operation of the reserve unit when the reserve unit receives the sleep signal.

13. The controlling method as claimed in claim 12, wherein the processing unit instructs the read/write unit to execute a write command.

14. The controlling method as claimed in claim 12, wherein the processing unit instructs the read/write unit to execute a read command.

15. The controlling method as claimed in claim 12, wherein the first data line is DAT1, and the second data line is DAT2.

16. The controlling method as claimed in claim 12, wherein a reserve unit is coupled to the first data line and the second data line.

17. The controlling method as claimed in claim 16, wherein the reserve unit is configured to output the external signal.

18. The controlling method as claimed in claim 12, wherein the external signal conforms to an inter-integrated circuit bus (I2C-BUS) protocol.

19. The controlling method as claimed in claim 12, wherein the reserve unit is further coupled to the processing unit.

20. The controlling method as claimed in claim 1, wherein the reserve unit is further coupled to the state machine.

21. The controlling method as claimed in claim 1, wherein the flash memory controller is an embedded flash memory controller.

* * * * *